United States Patent
Ding

(10) Patent No.: US 11,366,952 B2
(45) Date of Patent: Jun. 21, 2022

(54) METHOD, APPARATUS AND ELECTRONIC DEVICE FOR HESSIAN-FREE PHOTOLITHOGRAPHY MASK OPTIMIZATION

(71) Applicant: SHENZHEN JINGYUAN INFORMATION TECHNOLOGY CO., LTD, Shenzhen (CN)

(72) Inventor: Ming Ding, Shenzhen (CN)

(73) Assignee: SHENZHEN JINGYUAN INFORMATION TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 17/389,413

(22) Filed: Jul. 30, 2021

(65) Prior Publication Data

US 2022/0027547 A1    Jan. 27, 2022

Related U.S. Application Data

(63) Continuation of application No. PCT/CN2019/073988, filed on Jan. 30, 2019.

(51) Int. Cl.
*G06F 30/398* (2020.01)
*G03F 7/20* (2006.01)

(52) U.S. Cl.
CPC ........ *G06F 30/398* (2020.01); *G03F 7/70433* (2013.01)

(58) Field of Classification Search
CPC ............................ G06F 30/398; G03F 7/70433
(Continued)

(56) References Cited

U.S. PATENT DOCUMENTS 8,356,261 B1 * 1/2013 Socha ............... G03F 7/705
716/54
9,111,062 B2 * 8/2015 Chen ............... G03F 7/70441
(Continued)

FOREIGN PATENT DOCUMENTS

CN       101788759 A    7/2010
CN       102224459 A    10/2011
(Continued)

*Primary Examiner* — Suchin Parihar
(74) *Attorney, Agent, or Firm* — Andrew C. Cheng

(57) ABSTRACT

The present invention relates generally to the technical field of integrated circuit mask design, and more particularly to a method, an apparatus and an electronic device for Hessian-Free photolithography mask optimization. The method includes steps: S1, inputting a design layout of a mask to be optimized; S2, positioning error monitoring points on the design layout of the mask to be optimized; S3, obtaining an optimization variable x of the mask to be optimized; S4, forming an objective function cost on the optimization variable x; and S5, optimizing the objective junction cost by a Hessian-Free-based conjugate gradient method, to obtain an optimization result of the mask to be optimized. Optimizing the objective function cost based on a Hessian-Free conjugate gradient method to obtain an optimization result of the mask to be optimized, which can greatly reduce the computation resources in the optimization process, make the optimization process simpler, feasible, and improve the optimization efficiency. Meanwhile, there is no need to use the quasi-Newton method to obtain the approximate replacement matrix of the H matrix, which can improve the accuracy of the optimization result.

9 Claims, 9 Drawing Sheets

(58) Field of Classification Search
USPC .......................................................... 716/51
See application file for complete search history.

(56) References Cited

U.S. PATENT DOCUMENTS

| | | | |
|---|---|---|---|
| 10,210,295 B2 * | 2/2019 | Rosenbluth | G06F 30/367 |
| 10,571,799 B1 * | 2/2020 | Li | G06F 30/39 |
| 2014/0359543 A1 | 12/2014 | Tao et al. | |

FOREIGN PATENT DOCUMENTS

| | | |
|---|---|---|
| CN | 102981355 A | 3/2013 |
| CN | 102998896 A | 3/2013 |

* cited by examiner

METHOD, APPARATUS AND ELECTRONIC DEVICE FOR HESSIAN-FREE PHOTOLITHOGRAPHY MASK OPTIMIZATION

TECHNICAL FIELD

The present invention relates generally to the technical field of integrated circuit mask design, and more particularly to a method, an apparatus and an electronic device for Hessian-Free photolithography mask optimization.

BACKGROUND

Photolithography is one of the most important parts of the integrated circuit manufacturing process, which determines the advanced level of the integrated circuit manufacturing process. The litho cell is usually described as an optical imaging system, including four basic elements—an illumination source, a mask, a projection objective lens system, and a silicon wafer coated with photoresist. As the critical dimension of integrated circuits enters into the technology node of 45 nm, and constantly moves towards a smaller dimension of 32 nm or even 22 nm, the pattern dimension to be exposed is much smaller than the wavelength of the light source in the litho cell. Thus, the Optical Proximity Effect (OPE) caused by the interference and diffraction of light waves in the photolithography imaging system has become more and more significant. This causes the exposure pattern formed on the silicon wafer to be extremely deformed compared with the mask pattern used. Therefore, when practically designing a mask for the litho cell, it is necessary to adjust the mask pattern in advance considering this Optical Proximity Effect, so as to make the exposure pattern obtained on the silicon wafer more close to the target pattern.

The existing mask optimization methods are generally divided into a first-order accuracy method (steepest descent method, conjugation gradient method, etc.) and a second-order accuracy method (Newton method). The first-order accuracy method needs to calculate a first derivative of the objective function with respect to the optimization variable. The second-order accuracy method needs to calculate a first derivative and a second derivative of the objective function with respect to the optimization variable. Since the second-order accuracy method uses more information of the objective function, its numerical convergence rate will be much faster than that of the first-order accuracy method. However, as for the mask optimization problem of the inverse lithography technology, the number of variables is extremely large, often reaching millions of levels, and the calculation process of lithography simulation is complicated. The computation resources required for calculating the second derivative of the objective function with respect to the optimization variable are extremely large, which is not feasible in practice. Therefore, the Newton method is not suitable for the mask optimization problem of the inverse lithography technology. Generally, a second-order accuracy method of the quasi-Newton method, such as the L-BFGS method, is used. The quasi-Newton method only needs to calculate the first derivative of the objective function with respect to the optimization variable, and approximate the second derivative by some simple relations (Hessian matrix). Due to the similarity of the Hessian matrix, the variation tendency of the objective function cannot be truly reflected, in some circumstances, which will cause the convergence rate of this optimization method slower, or even fail to obtain good optimization results.

SUMMARY

To overcome the defect that the existing mask optimization technology is complicated, the present invention provides a method, an apparatus and an electronic device for Hessian-Free mask optimization.

To solve the technical problem, an embodiment of the present invention provides a method for Hessian-Free photolithography mask optimization, for optimizing a mask to be optimized. The method includes the following steps: S1, inputting a design layout of a mask to be optimized; S2, positioning error monitoring points on the design layout of the mask to be optimized; S3, obtaining an optimization variable x of the mask to be optimized; S4, forming an objective function cost on the optimization variable x; and S5, optimizing the objective function cost by a Hessian-Free-based conjugate gradient method, to obtain an optimization result of the mask to be optimized.

Preferably, the objective function cost is defined as:

$$\text{cost} = \sum_{i,j} W_{ci} \cdot W_{pj} \cdot [\text{Signal}(ci, pj)]^{power}.$$

In the formula, ci is an i-th exposure condition, pj is a j-th error monitoring point, power is a preset positive and even value (power=2, 4, 6 . . . ), Signal(ci, pj) is a signal error value at the j-th error monitoring point under the i-th exposure condition. The signal error value includes an intensity of RI or a value of EPE, the RI is an image on a photoresist, and the EPE is an edge placement error.

Preferably, the mask to be optimized includes at least one main pattern. In step S3, the optimization variable x of the mask to be optimized includes edges of the main pattern and/or assistant feature sample points generated around the main pattern, or edges of an assistant feature which is generated according to signal values of the assistant feature sample points.

Preferably, step S5 specifically includes the following steps: S51, setting an initial optimization variable value $x_0$ of the objective function cost; S52, calculating a gradient value $g_0$ of the initial optimization variable value $x_0$; S53, determining whether the gradient value $g_0$ is less than a preset threshold; if so, performing the following step: S54, terminating the optimization process, and obtaining an optimization result of the mask to be optimized; if not, performing the following step: S55, iteratively updating an optimization variable $x_k$ based on a relation between $H \cdot p_k$ and an intrinsic vector $v_k$ of the optimization variable $x_k$, to obtain an updated optimization variable $x_{k+1}$. H is a Hessian matrix of the objective function cost. $p_k = -g_k$, and $g_k$ is a gradient of the optimization variable $x_k$ relative to the objective function cost.

Preferably, step S55 includes the following steps: S551, calculating a coefficient $\alpha_k$; S552, calculating a coefficient $v_{k+1} = v_k + \alpha_k p_k$; and S553, updating the optimization variable: $x_{k+1} = x_k + v_{k+1}$. The $\alpha_k$ is defined as:

$$\alpha_k = \frac{r_k^T r_k}{p_k^T (H \cdot p_k)},$$

wherein $r_k = -g_k$, $p_k = r_k$, and $r_k^T$ is obtained by performing a transpose operation on $r_k$.

Preferably, step S5 further includes the following steps: S56, calculating a gradient value $r_{k+1}$ of the optimization variation $x_{k+1}$ which is iteratively optimized, by a calculation result of the $H \cdot p_k$; S57, determining whether $|r_{k+1}|$ is less than the preset threshold; if so, performing the following step: S58, terminating the optimization process; if not, performing the following step: S59, calculating coefficients $\beta_k$ and $p_{k+1}$, and returning to step S55 until the optimization process is finished, wherein $$\beta_k = \frac{r_{k+1}^T r_{k+1}}{r_k^T r_k}, \ p_{k+1} = r_{k+1} + \beta_k p_k.$$

Preferably, obtaining the $H \cdot p_k$ includes the following steps:
T01, defining an operator:

$$Rv[f(x)] \equiv \frac{\partial f(x + rv)}{\partial r} \bigg| r = 0;$$

T02, calculating $(H \cdot v)_k$.
The $(H \cdot v)_k$ can be calculated by the following formula:

$$(H \cdot v)_k = \sum_i p \cdot (p-1) \cdot [\text{Signal}(ci, pj)]^{p-1} \cdot \frac{\partial [\text{Signal}(ci, pj)](x)}{\partial x_k} \cdot Rv([\text{Signal}(ci, pj)]).$$

Preferably, in step T02, when the Signal(ci, pj) is the intensity of the RI, the intensity of the RI can be obtained by the following steps:
T021, calculating $$RI_i = \sum_m q_{im} AI_m,$$

wherein $q_{im}$ is a photoresist coefficient;
T022, calculating $$AI_m = \sum_n \lambda_n |EI_{n,m}|^2,$$

wherein $\lambda_n$ is a n-th intrinsic coefficient of a TCC matrix;
T023, calculating $$EI_{n,m} = \sum_t h_{m,t} MI_t,$$

wherein $h_{m,t}$ is an intrinsic vector of the TCC matrix;
T024, calculating $$MI_t = MI_t(0) + \sum_o s_{t,o} \cdot E_o + \sum_l d_{t,l} P_l,$$

wherein $s_{t,o}$ and $d_{t,l}$ are linear coefficients of a calculation from a mask to a gridded mask, $E_o$ is an offset variable of the edges of the main pattern, $P_l$ is the signal value of the assistant feature sample points. $MI_t(0)$ is an initial value, that is, an initial MI when the $E_o$ and the $P_l$ are both 0:
T025, calculating $$Rv(MI_t) = \sum_o s_{t,o} \cdot v_o + \sum_l d_{t,l} \cdot v_l,$$

wherein $v_o$ is an o-th component of v, $v_l$ is a l-th component of v; and
T026, calculating Rv(RI).

Preferably, the Rv(RI) can be obtained by the following steps:
T0261, calculating $$Rv(RI_i) = \sum_m q_{im} Rv(AI_m);$$

T0262, calculating $$Rv(AI_m) = \sum_n \lambda_n \cdot [EI_{n,m} \cdot Rv(EI_{n,m}^*) + Rv(EI_{n,m}) \cdot EI_{n,m}^*];$$

T0263, calculating $$Rv(EI_{n,m}) = \sum_t h_{m,t} \cdot Rv(MI_t);$$

and
T0264, calculating $$Rv(EI_{n,m}^*) = \sum_t h_{m,t}^* Rv(MI_t^*).$$

Wherein $Rv(EI^*_{n,m})$ can be obtained by performing a conjugate operation on $Rv(EI_{n,m})$, $h^*_{m,t}$ can be obtained by performing a conjugate operation on $h_{m,t}$, $EI^*_{n,m}$ can be obtained by performing a conjugate operation on $EI_{n,m}$, and $Rv(MI^*_t)$ can be obtained by performing a conjugate operation on $Rv(MI_t)$.

Preferably, when the Signal(ci, pj) is the value of the EPE, the value of the EPE can be obtained by the following steps:
T027, calculating $$EPE_i = \frac{RI_t}{RI'_t};$$

T028, calculating $$RI'_i = \sum_j d_{i,j} RI_j,$$

wherein $RI'_i$ is a gradient of the RI at a monitoring point i;

T029, calculating $$Rv(EPE_i) = Rv\left(\frac{RI_i}{RI'_i}\right)$$
$$= -\frac{RI_i}{(RI'_i)^2} Rv(RI'_i) + \frac{1}{RI'_i} Rv(RI_i);$$

and

T030, calculating $$Rv(RI'_i) = \sum_j d_{i,j} Rv(RI_j).$$

Wherein $d_{i,j}$ is the linear coefficient of the calculation from the mask to the gridded mask, and Rv(RI) can be obtained by the above steps T0261-T0264.

To solve the above-mentioned technical problem, another embodiment of the present invention further provides an apparatus for Hessian-Free photolithography mask optimization. The apparatus includes an input module, configured to input a design layout of a mask to be optimized; an error monitoring point positioning module, configured to position error monitoring points on the design layout of the mask to be optimized; an optimization variable generation module, configured to obtain an optimization variable x of the mask to be optimized; an objective function generation module, configured to form an objective function cost on the optimization variable x; and an optimization computation module, configured to optimize the objective function cost based on a Hessian-Free-based conjugate gradient method to obtain an optimization result of the mask to be optimized.

To solve the above-mentioned technical problem, another embodiment of the present invention further provides an electronic device. The electronic device includes one or more processors, and a storage device for storing one or more programs. When the one or more programs are executed by the one or more processors, the one or more processors implement any step of the method for Hessian-Free photolithography mask optimization described above.

Compared with the prior arts, optimizing the objective function cost based on a Hessian-Free conjugate gradient method to obtain an optimization result of the mask to be optimized, which can greatly reduce the computation resources in the optimization process, make the optimization process simpler, feasible, and improve the optimization efficiency. Meanwhile, there is no need to use the quasi-Newton method to obtain the approximate replacement matrix of the H matrix, which can improve the accuracy of the optimization result.

Iteratively updating an optimization variable $x_k$ based on the relation between $H \cdot p_x$ and an intrinsic vector $v_k$ of the optimization variable $x_k$, to obtain an updated optimization variable $x_{k+1}$, which can avoid the problem that the H matrix needs to be calculated separately in the optimization process and the result is wrong due to the large amount of calculations, and greatly improve the calculation efficiency.

The apparatus and electronic device for Hessian-Free photolithography mask optimization provided by the present invention have the same beneficial effects as the method for Hessian-Free photolithography mask optimization.

DETAILED DESCRIPTION

In order to make the objectives, technical solutions, and advantages of the present invention clearer, the present invention is further described in detail below with reference to the accompanying drawings and embodiments. It should be understood that the specific embodiments described herein are provided for illustration only, and not for the purpose of limiting the invention.

Figure 1:
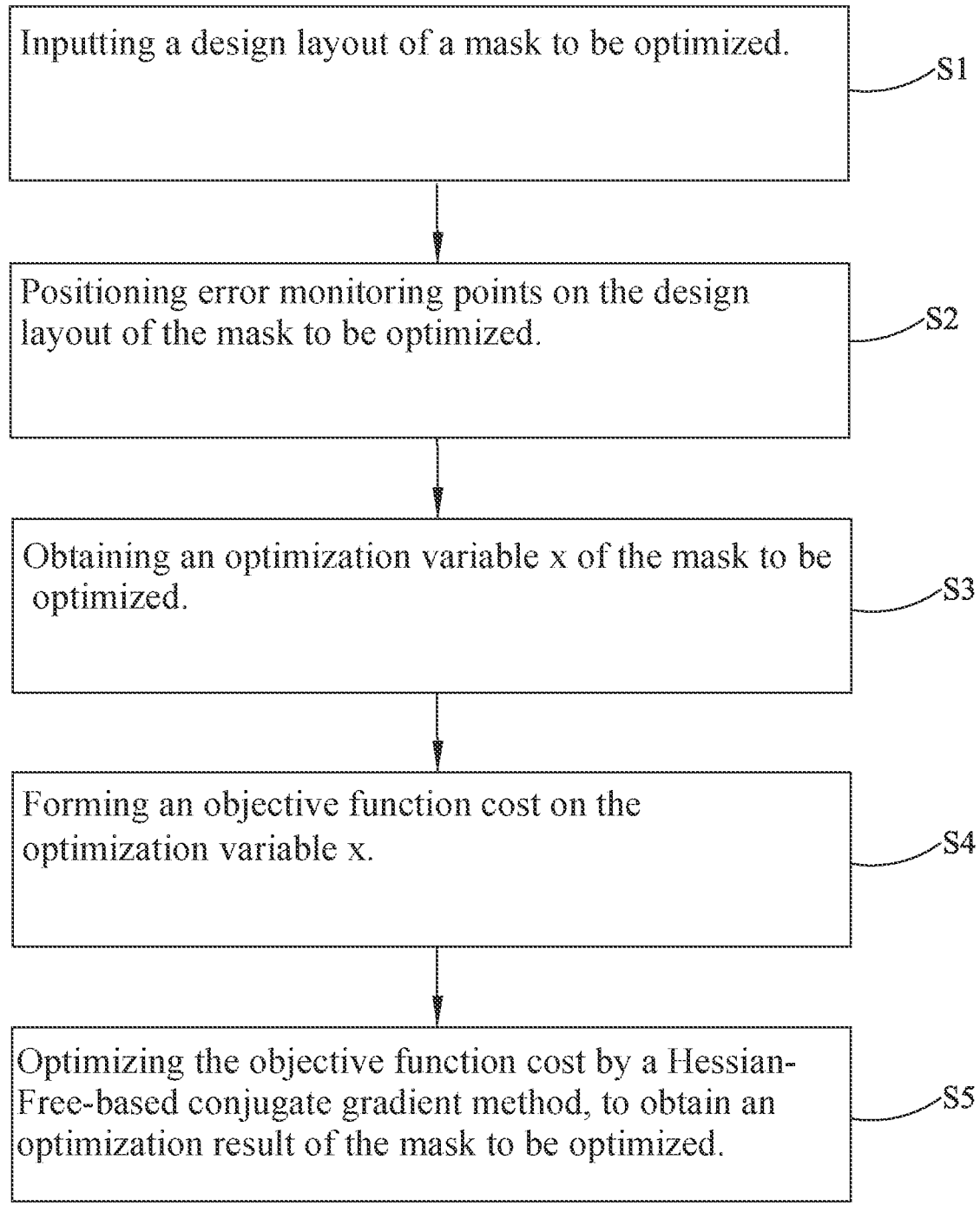
FIG. 1 is a flowchart of a method with steps S1-S5 for Hessian-Free photolithography mask according to a first embodiment of the present invention.

Referring to FIG. 1, a first embodiment of the present invention provides a method for Hessian-Free photolithography mask optimization, for optimizing a mask to be optimized. The method includes the following steps:

S1, inputting a design layout of a mask to be optimized.

Figure 2:
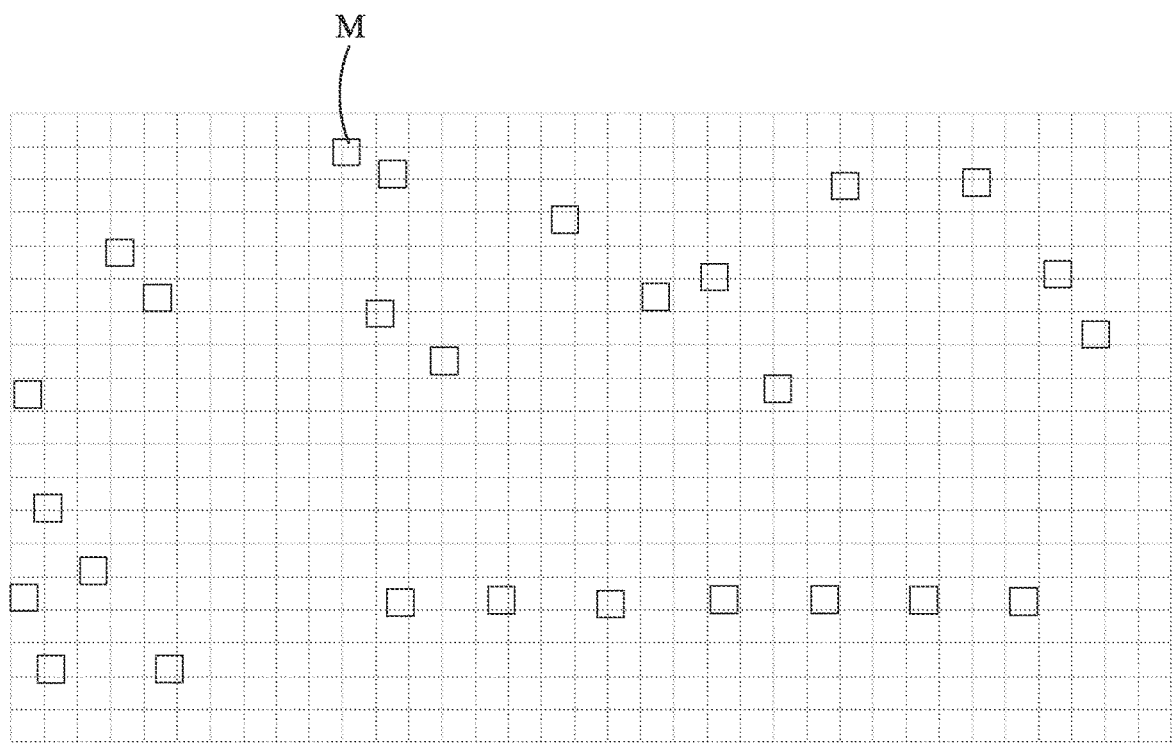
FIG. 2 is a schematic diagram of a design layout of a mask to be optimized in the method according to the first embodiment of the present invention.

In this embodiment, a design pattern of a target chip is provided first, a mask layout corresponding to the design pattern of the target chip is designed accordingly. The mask layout is laid out according to photolithographic requirements of the design pattern of the target chip, that is, the design layout of the mask to be optimized is obtained, including at least one main pattern thereon. In this step, FIG. 2 shows the design layout of the mask to be optimized, and the area M is the main pattern. Generally, the main pattern is also called an exposure pattern, which will be transferred to an semiconductor device after exposure. In this embodiment, the main pattern M is configured as a rectangle. In other embodiments, the main pattern can be configured as other patterns, mainly depending on specific shapes of the target chip, such as trapezoids, irregular polygons, regular polygons and other patterns. Preferably, the inputted design layout of the mask to be optimized exists in GDS format.

Referring to FIG. 1 again, the method for Hessian-Free photolithography mask optimization further includes the following steps:

S2, positioning error monitoring points on the design layout of the mask to be optimized.

Figure 3:
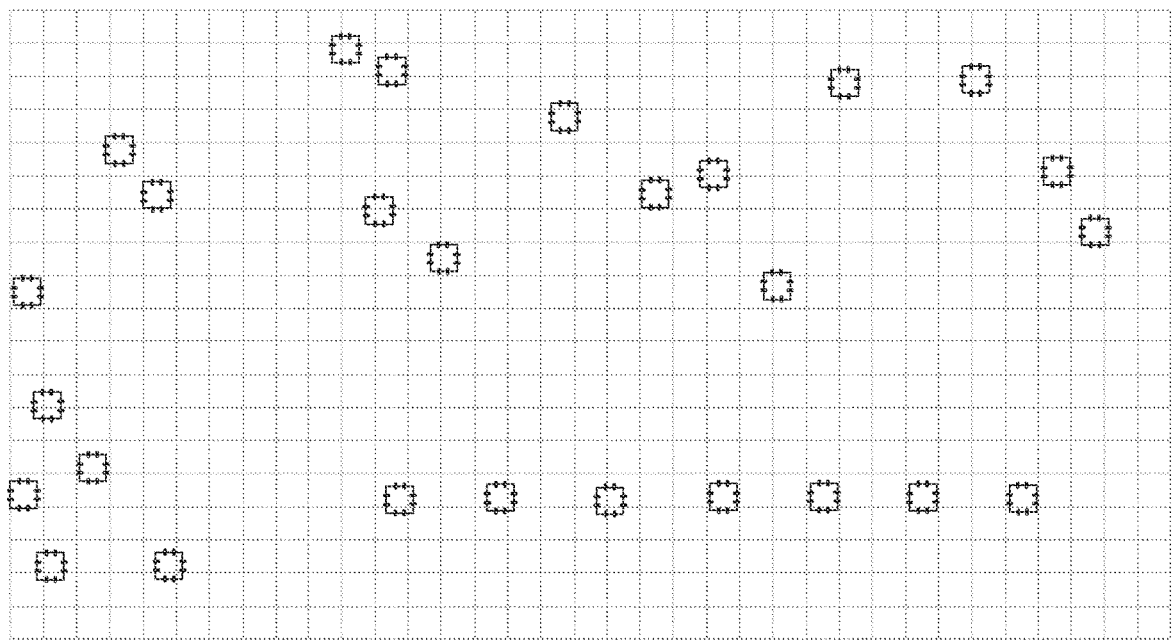
FIG. 3 is a schematic diagram of error monitoring points in the method according to the first embodiment of the present invention.

Referring to FIG. 3, the error monitoring points are placed on the design layout of the mask to be optimized, that is, on the main pattern. The function of the error monitoring points is to determine whether the iteratively optimized mask is qualified, by detecting the difference between edges of an exposed photoresist pattern which is simulated by the lithography software and that of the design pattern. The error monitoring points can be placed according to human experience. As shown in FIG. 3, the error monitoring points can be placed on edges of the main pattern. In some other embodiments, the error monitoring points can be placed at corners of the main pattern, specifically at the corners close to the central location.

Referring to FIG. 1 again, the method for Hessian-Free photolithography mask optimization further includes the following steps:

S3, obtaining an optimization variable x of the mask to be optimized.

In this step, the optimization variable x of the mask to be optimized includes the edges of the main pattern and/or assistant feature sample points which are generated around the main pattern; or edges of an assistant feature which is generated according to signal values of the assistant feature sample points.

Figure 4:
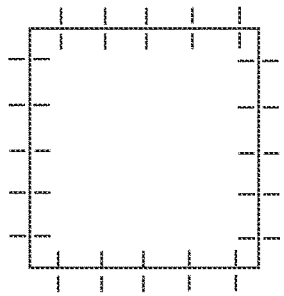
FIG. 4 is a schematic diagram of dividing edges of a main pattern when the edges of the main pattern are regarded as an optimization variable in the method according to the first embodiment of the present invention.

Referring to FIG. 4, when the edges of the main pattern are regarded as the optimization variable x, the edges of the main pattern are divided into short edges of small line segments. Each short edge is marked as different types based on their locations. The short edge is a basic unit in the optimization process, wherein the short edges at different locations obtain different optimization variables. The division process makes the optimized object more clear, single and accurate, which can avoid the problem that the situation is too complicated when an overall optimization of the main pattern is performed. In this step, the optimization strategy of regarding the short edges as the optimization variable for optimization mainly corresponds to the movement of the line segments. Select different moving directions and moving steps according to different locations of different line segments and imaging features of the pattern on the photoresist, step by step, and iterate multiple times until the final optimization result is obtained.

Figure 5:
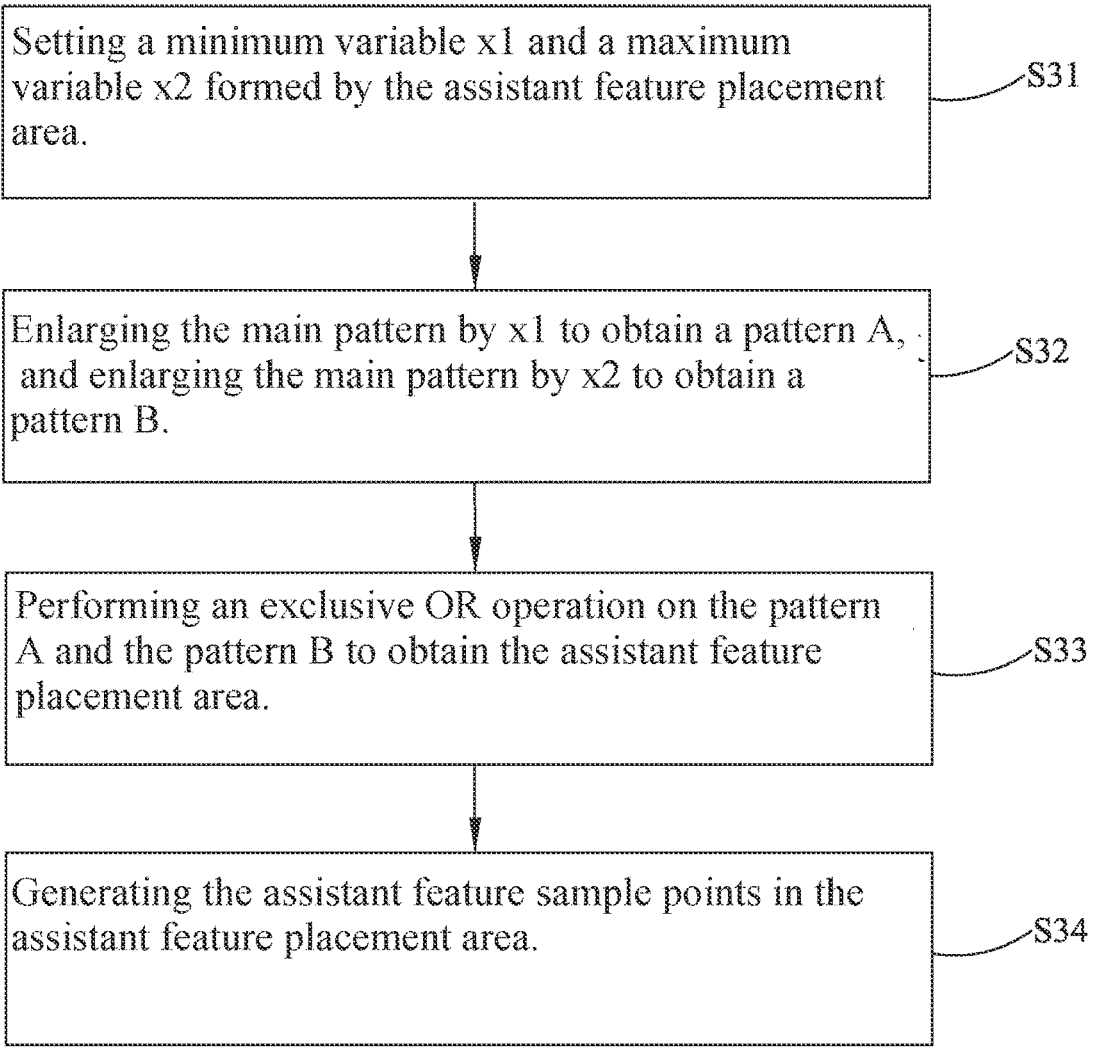
FIG. 5 is a detailed flowchart of step S3 in the method of FIG. 1 according to the first embodiment of the present invention.

In a first alternative embodiment of the first embodiment of the present invention, the assistant feature sample points generated around the main pattern are regarded as the optimization variable x. An assistant feature placement area is formed around the main pattern according to a predetermined rule. The assistant feature sample points are generated in the assistant feature placement area, to optimize the mask to be optimized. The signal values of the assistant feature sample points are monitored, and the assistant feature sample points where the assistant feature should be generated are obtained according to the signal values. Referring to FIG. 5, as an embodiment, the generation of the assistant feature sample points specifically includes the following steps:

S31, setting a minimum variable x1 and a maximum variable x2 formed by the assistant feature placement area.

In this step, the minimum variable x1 and the maximum variable x2 are enlargement coefficients of the main pattern, wherein the minimum variable x1 is less than or equal to the maximum variable x2, the minimum variable x1 is greater than or equal to zero, and the maximum variable x2 is not equal to zero.

Referring to FIG. 5 again, the generation of the assistant feature sample points further includes the following steps:

S32, enlarging the main pattern by x1 to obtain a pattern A, and enlarging the main pattern by x2 to obtain a pattern B. The minimum variable x1 and maximum variable x2 can be set as follows: the closest distance between edges of the pattern A and that of the main pattern is d1, and the closest distance between edges of the pattern B and that of the main pattern is d2. Specifically, the value range of d1 is 20-100 nm, and the value range of d2 is 100-400 nm.

Figure 6:
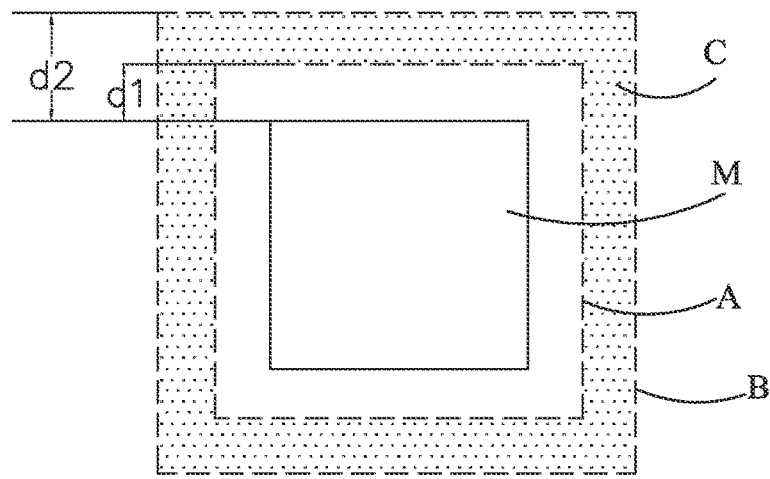
FIG. 6 is a schematic diagram of an assistant feature placement area in the method according to the first embodiment of the present invention.

In this step, the pattern A and the pattern B are shown in FIG. 6.

Referring to FIG. 5, the generation of the assistant feature sample points further includes the following steps:

S33, performing an exclusive OR operation on the pattern A and the pattern B to obtain the assistant feature placement area.

In this step, the assistant feature placement area is an area C enclosed and formed by edges of the pattern A and the pattern B, which corresponds to the filled area in FIG. 6. It can be seen that the profile of the assistant feature placement area is consistent with that of the main pattern.

Referring to FIG. 5 again, the placement of the assistant feature sample points further includes the following steps:

S34, generating the assistant feature sample points in the assistant feature placement area.

In this step, after the assistant feature sample points are generated, an initial signal value assigned to each assistant feature sample point is 0. In the optimization process, when the signal value of the assistant feature sample point exceeds a predetermined threshold, then the assistant feature is generated at a location corresponding to this assistant feature sample point, otherwise, it is not generated.

In this step, the assistant feature sample points are generated according to a predetermined rule. Specifically, the predetermined rule can be: setting multiple rows of assistant feature sample points, a preset spacing between any two adjacent assistant feature sample points in the same row is x, and the row spacing of any two adjacent rows is also x. In the specific optimization process, the value of x can be adjusted according to actual optimization effects.

In some other embodiments, in order to generate the assistant feature sample points more quickly and accurately, the assistant feature placement area can be divided into multiple rectangular blocks, and the assistant feature sample points are generated at the preset spacing x in each rectangular block.

Figure 7:
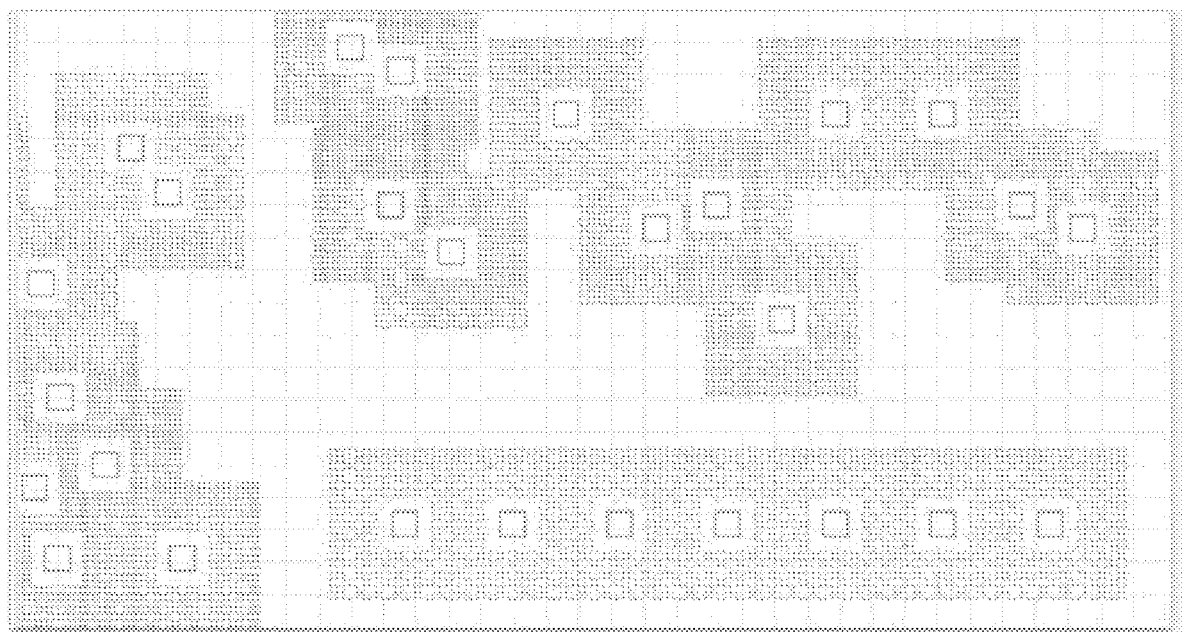
FIG. 7 is a schematic diagram of assistant feature sample points in the method according to the first embodiment of the present invention.

Referring to FIG. 7, it shows the assistant feature sample points which are generated in the assistant feature placement area.

In a second alternative embodiment of the first embodiment of the present invention, the edges of the main pattern and the assistant feature sample points are regarded as the optimization variable x.

In a third alternative embodiment of the first embodiment of the present invention, the edges of the assistant feature generated according to the signal values of the assistant feature sample points are regarded as the optimization variable x. This optimization method for optimizing the assistant feature is similar to that for optimizing the main pattern with the edges of the main pattern regarded as the optimization variable. Similarly, the edges of the assistant feature are divided into short edges, and the short edges are moved correspondingly to optimize the assistant feature. As shown in FIG. 7, it shows a final optimized mask pattern.

It should be noted that in addition to the optimization variables provided above, other optimization variables are also feasible.

Referring to FIG. 1 again, the method for Hessian-Free photolithography mask optimization further includes the following steps:

S4, forming an objective function cost on the optimization variable x; and

S5, optimizing the objective function cost by a Hessian-Free-based conjugate gradient method, to obtain an optimization result of the mask to be optimized.

In step S4, as an embodiment, the objective function cost is defined as:

$$cost = \sum_{i,j} W_{ci} \cdot W_{pj} \cdot [Signal(ci, pj)]^{power}.$$

In the formula, ci is an i-th exposure condition, pj is a j-th error monitoring point, power is a preset positive and even value (power=2, 4, 6 . . . ), Signal(ci, pj) is a signal error value at the j-th error monitoring point under the i-th exposure condition. The signal error value includes one of an intensity of RI or a value of EPE. The RI is an image on a photoresist, and the EPE is an edge placement error.

Figure 8:
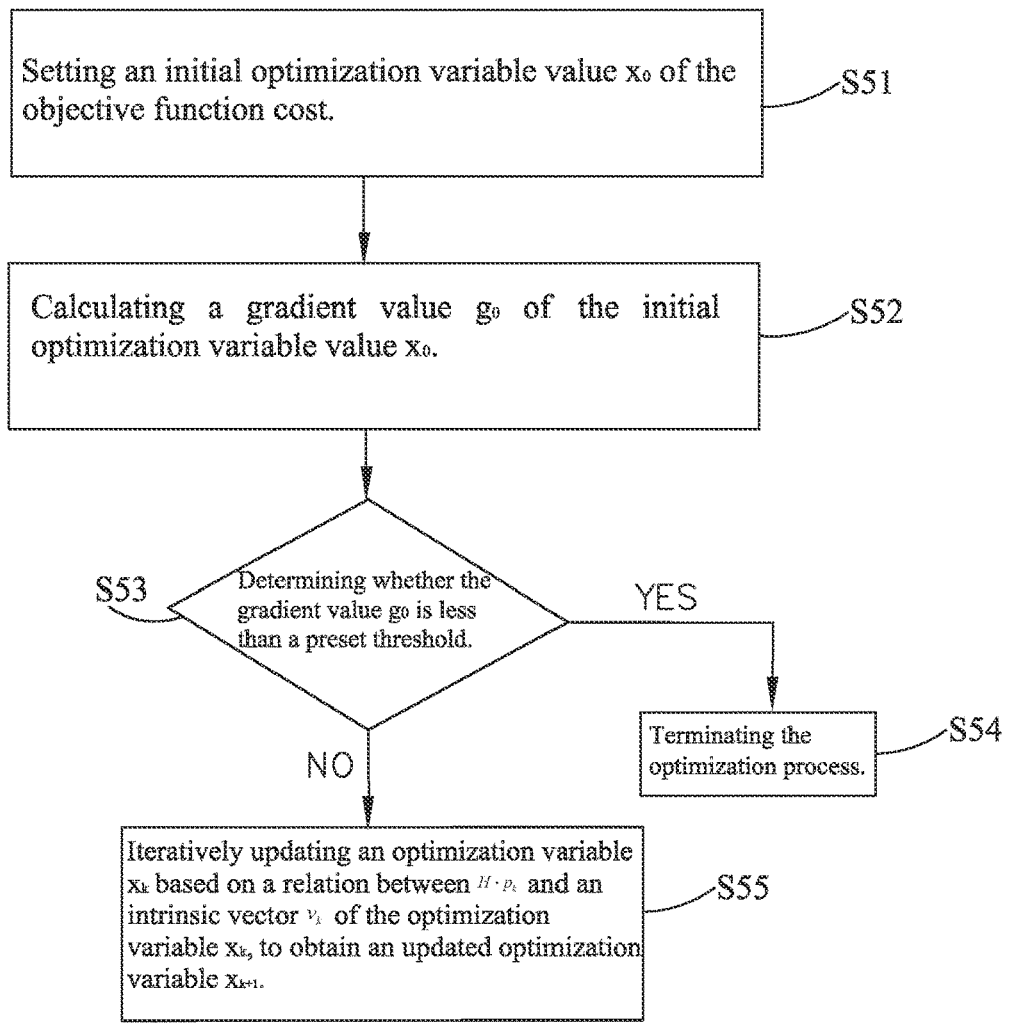
FIG. 8 is a detailed flowchart of step S5 in the method of FIG. 1 according to the first embodiment of the present invention.

Referring to FIG. 8, step S5 specifically includes the following steps:

S51, setting an initial optimization variable value $x_0$ of the objective function cost.

In this step, for example, when the edges of the main pattern are regarded as the optimization variable, the corresponding initial optimization variable value $x_0$ is a moving distance which is randomly set, specifically 2 nm.

S52, calculating a gradient value $g_0$ of the initial optimization variable value $x_0$.

In this step, the following example is given to illustrate the gradient value $g_0$ when the edges of the main pattern are regarded as the initial optimization variable value $x_0$. The gradient of the initial optimization variable value $x_0$ of the objective function cost can be obtained based on the following cascade relational expression:

$$\frac{\partial Cost}{\partial x_0} = \frac{\partial AI}{\partial x_0} \cdot \frac{\partial cost}{\partial AI} \quad 1)$$

The calculation of all formulas in the relational expression 1) is consistent with the process of the existing ILT (Inverse Lithography Technology), which will not be repeated here.

S53, determining whether the gradient value $g_0$ is less than a preset threshold; if so, performing the following step:

S54, terminating the optimization process, and obtaining an optimization result of the mask to be optimized. If not, performing the following step:

S55, iteratively updating an optimization variable $x_k$ based on a relation between $H \cdot p_k$ and an intrinsic vector $v_k$ of the optimization variable $x_k$, to obtain an updated optimization variable $x_{k+1}$.

Figure 9:
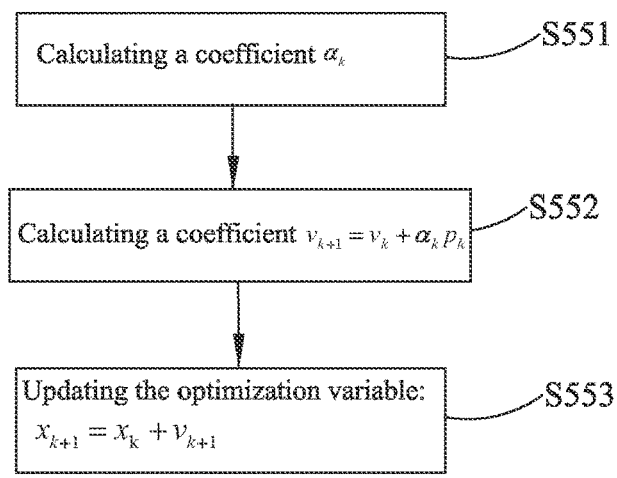
FIG. 9 is a detailed flowchart of step S55 in the method of FIG. 8 according to the first embodiment of the present invention.

In step S55, firstly set the number of iterations k=0 (K=0, 1, 2, 4, 5 . . . ). Referring to FIG. 9, step S55 specifically includes the following steps:

S551, calculating a coefficient $\alpha_k$.

The $\alpha_k$ is defined as:

$$\alpha_k = \frac{r_k^T r_k}{p_k^T (H \cdot p_k)},$$

wherein $r_k = -g_k$, $p_k = r_k$, $r_k^T$ is obtained by performing a transpose operation on $r_k$.

S552, calculating a coefficient $v_{k+1} = v_k + \alpha_k p_k$.

In the formula, $v_k$ is a multidimensional vector. For example, when the edges of the main pattern are the optimization variable, each component is a location variation value of the edges of the main pattern during the process of iterating the optimization variable for k times. It can be seen that the $v_k$ is a known value. It can be understood that, when the assistant feature sample points are the optimization variable, each component corresponds to a signal variation value of the assistant feature sample points during the process of iterating the optimization variable for k times.

S553, updating the optimization variable: $x_{k+1} = x_k + v_{k+1}$.

Figure 10:
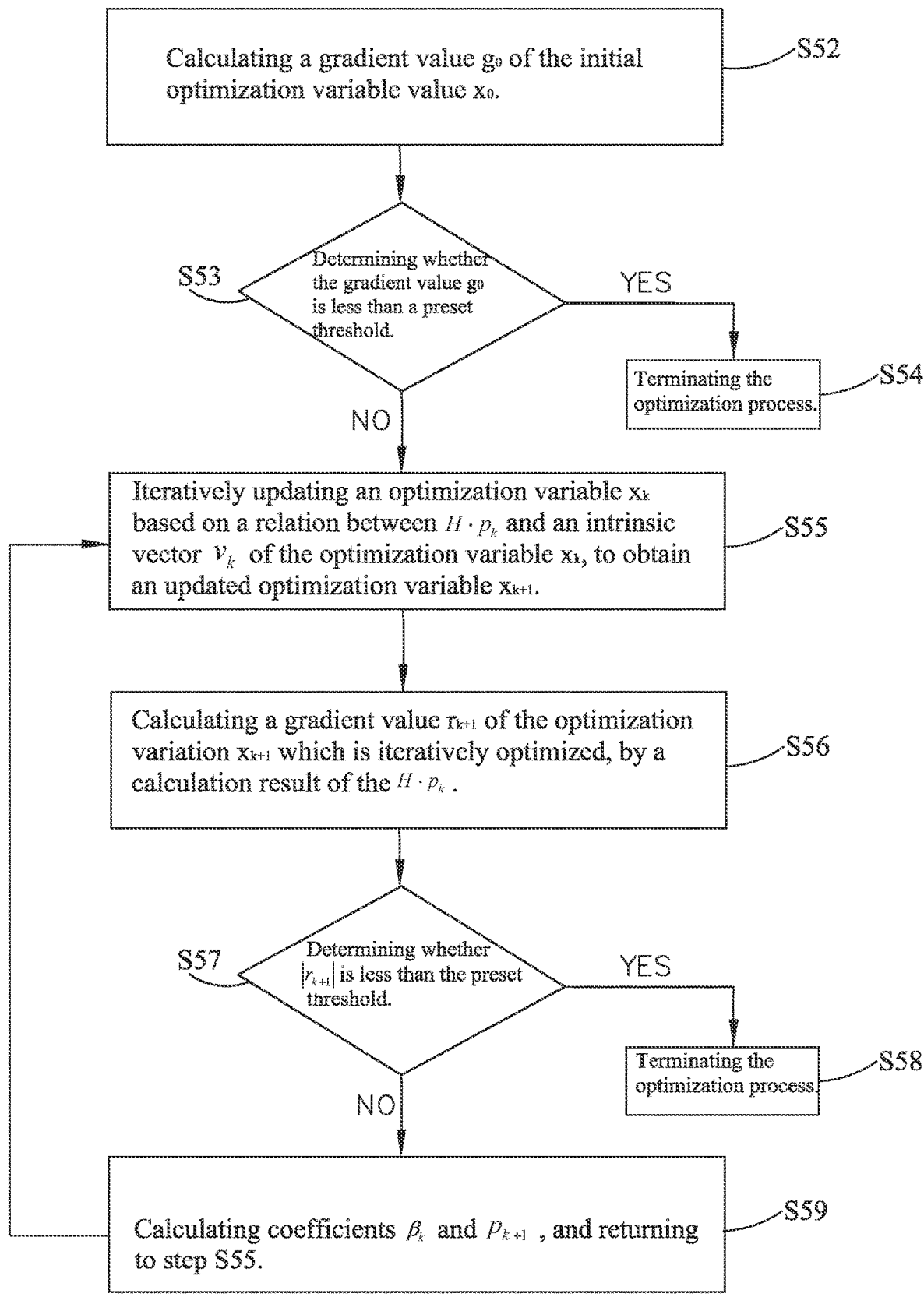
FIG. 10 is another detailed flowchart of step S5 in the method of FIG. 1 according to the first embodiment of the present invention.

Referring to FIG. 10, step S5 further includes the following steps:

S56, calculating a gradient value $r_{k+1}$ of the optimization variation $x_{k+1}$ which is iteratively optimized, by a calculation result of the $H \cdot p_k$.

In this step, $r_{k+1}$ is obtained by the following formula: $r_{k+1} = r_k - \alpha_k (H \cdot p_k)$.

S57, determining whether $|r_{k+1}|$ is less than the preset threshold; if so, performing step S58, terminating the optimization process, and obtaining the optimization result of the mask to be optimized; if not, performing the following step:

S59, calculating coefficients $\beta_k$ and $p_{k+1}$, and returning to step S55. $\beta_k$ and $p_{k+1}$ are defined as:

$$\beta_k = \frac{r_{k+1}^T r_{k+1}}{r_k^T r_k}, \quad 1)$$

$$p_{k+1} = r_{k+1} + \beta_k p_k. \quad 2)$$

In the above steps, obtaining the $H \cdot p_k$ includes the following steps:

It should be noted that, the $p_k$ in the $H \cdot p_k$ is an intrinsic value related to all optimization variables of the k-th iteration. Therefore, in the following steps, v in $(H \cdot v)_k$ represents the $p_k$ of any iteration, and the $(H \cdot v)_k$ is a k-th component of $(H \cdot v)$.

T01, defining an operator:

$$Rv[f(x)] \equiv \frac{\partial f(x+rv)}{\partial r}\bigg|r=0;$$

T02, calculating $(H \cdot v)_k$;
$(H \cdot v)_k$ can be calculated by the following formula:

$$(H \cdot v)_k = \sum_i p \cdot (p-1) \cdot [\text{Signal}(ci, pj)]^{p-2} \cdot \frac{\partial [\text{Signal}(ci, pj)](x)}{\partial x_k} \cdot Rv([\text{Signal}(ci, pj)]).$$

In step T02, p is a preset positive and even value (p=4, 6, 8 . . . ). When Signal(ci, pj) is the intensity of the RI, the intensity of the RI can be obtained by the following steps:

T021, calculating $$RI_i = \sum_m q_{im} AI_m.$$

In the formula, $q_{im}$ is a photoresist coefficient which can be obtained by multiple measurements of lithography models under a preset series of known illumination conditions, $AI_m$ is an optical exposure dose value at a location m, which can be obtained by step T022.

T022, calculating $$AI_m = \sum_n \lambda_n |EI_{n,m}|^2.$$

In the formula, $\lambda_n$ is a n-th intrinsic coefficient of a TCC matrix, $EI_{n,m}$ is a value of a n-th intrinsic electric field at the location m. In this step, $\lambda_n$ can be obtained based on a TCC optical imaging theory, which specifically includes the following steps.

T0221, calculating a cross transmission coefficient matrix; and

T0222, calculating a partial coherent kernel function.

In step T0221, the cross transmission coefficient matrix can be calculated by the existing analytical method, integral method, and Fourier transform method. The Fourier transform method can be applicable for different types of light sources and has a faster calculation rate. In this embodiment, the Fourier transform method is used for calculating.

In step T0222, firstly express the four-dimensional cross transmission coefficient matrix as a two-dimensional matrix, then perform an intrinsic value decomlocation on the two-dimensional matrix to obtain its intrinsic coefficient and intrinsic vector. The intrinsic vector corresponds to the partial coherent kernel function. In this step, the intrinsic value decomlocation of the cross transmission coefficient matrix is mainly based on an optical imaging model Hopkins (Hopkins statistic), and previous n items are retained. Each item is expressed by intrinsic coefficients and intrinsic vectors. Therefore, the n-th intrinsic coefficient $\lambda_n$ and the intrinsic vector are obtained. $EI_{n,m}$ is obtained by a convolution of MI and the intrinsic vector, specifically obtained by step T023.

T023, calculating $$EI_{n,m} = \sum_t h_{m,t} MI_t.$$

In the formula, $h_{m,t}$ is an intrinsic vector of the TCC matrix which can be obtained by the above step T0222; $MI_t$ is a mask image value at a location t, which can be obtained specifically by step T024.

T024, calculating $$MI_t = MI_t(0) + \sum_o s_{t,o} \cdot E_o + \sum_l d_{t,l} P_l.$$

In the formula, $s_{t,o}$ and $d_{t,l}$ are linear coefficients of a calculation from a mask to a gridded mask, $E_o$ is an offset variable of the edges of the main pattern, $P_l$ is a signal value of the assistant feature sample points. $MI_t(0)$ is an initial value, that is, an initial MI when the $E_o$ and the $P_l$ are both 0. It can be understood that $MI_t$ mentioned above is only an example, and adjustments are made according to specific optimization variables in actual calculations. For example, when the edges of the main pattern are the optimization variable, the formula should be adjusted as $$MI_t = MI_t(0) + \sum_o s_{t,o} \cdot E_o$$

In some specific embodiments, the $MI_t(0)$ can be obtained by performing a convolution operation on the mask pattern determined by the $E_o$, which specifically includes the following steps:

T0231, obtaining a low-pass filter matrix (convolution kernel) by performing a convolution operation; and T0232, calculating a product of neighboring pixels of each pixel point in the mask pattern and corresponding factors of the low-pass filter matrix, and adding values of the corresponding factors to obtain a feature value representing the pixel location, thereby forming a feature image of the main pattern.

It can be seen that the feature value on the feature image corresponds to $MI_t(0)$. It should be noted that, in this step, performing a convolution operation on the mask pattern determined by the $E_o$ is a conventional image filter convolution operation algorithm, which will not be repeated here.

T025, calculating $$Rv(MI_t) = \sum_o s_{t,o} \cdot v_o + \sum_l d_{t,l} \cdot v_l.$$

In the formula, $v_o$ is an o-th component of v, $v_l$ is a 1-th component of v.

T026, calculating Rv(RI).
Rv(RI) can be obtained by the following steps:

T0261, calculating $$Rv(RI_i) = \sum_m q_{im} Rv(AI_m);$$

T0262, calculating $$Rv(AI_m) = \sum_n \lambda_n \cdot [EI_{n,m} \cdot Rv(EI^*_{n,m}) + Rv(EI_{n,m}) \cdot EI^*_{n,m}];$$

T0263, calculating $$Rv(EI_{n,m}) = \sum_t h_{m,t} \cdot Rv(MI_t);$$

and
T0264, calculating $$Rv(EI^*_{n,m}) = \sum_t h^*_{m,t} Rv(MI^*_t).$$

Wherein, $Rv(EI^*_{n,m})$ can be obtained by performing a conjugate operation on $Rv(EI_{n,m})$. Similarly, $h^*_{m,t}$ can be obtained by performing a conjugate operation on $h_{m,t}$, $EI^*_{n,m}$ can be obtained by performing a conjugate operation on $EI_{n,m}$, and $Rv(MI^*_t)$ can be obtained by performing a conjugate operation on $Rv(MI_t)$.

In some other embodiments, when the Signal(ci, pj) is EPE (edge placement error), the EPE can be obtained by the following steps:

T027, calculating $$EPE_i = \frac{RI_i}{RI'_i};$$

T028, calculating $$RI'_i = \sum_j d_{i,j} RI_j,$$

wherein $RI'_i$ is a gradient of the RI at a monitoring point i;
T029, calculating $$Rv(EPE_i) = Rv\left(\frac{RI_i}{RI'_i}\right)$$
$$= -\frac{RI_i}{(RI'_i)^2} Rv(RI'_i) + \frac{1}{RI'_i} Rv(RI_i);$$

and
T030, calculating $$Rv(RI'_i) = \sum_j d_{i,j} Rv(RI_j).$$

In the formula, $RI_i$ can be obtained by the above steps T021-T023, which will not be repeated here. $d_{t,j}$ is a linear coefficient of a calculation from the mask to the gridded mask.

Rv(RI) can be obtained by the above steps T0261-T0264, which will not be repeated here.

In some other embodiments, if there are multiple exposure conditions, $$Cost = \sum_j Cost_j, H.v = \sum_j H_j \cdot v.$$

$H_j \cdot v$ under each exposure condition can be obtained by the calculation provided above. In this embodiment, multiple exposure conditions are used for measurement, specifically including standard exposure conditions (NC), exposure dose +3% (PD3), exposure dose −3% (ND3), defocus +40 nm (PF40), defocus −40 nm (NF40). The standard exposure condition means that the mask aligner is in an ideal working state, that is, the exposure value is at the preset standard value, and the lens focus is also at the preset standard value, without deviation.

Figure 11:
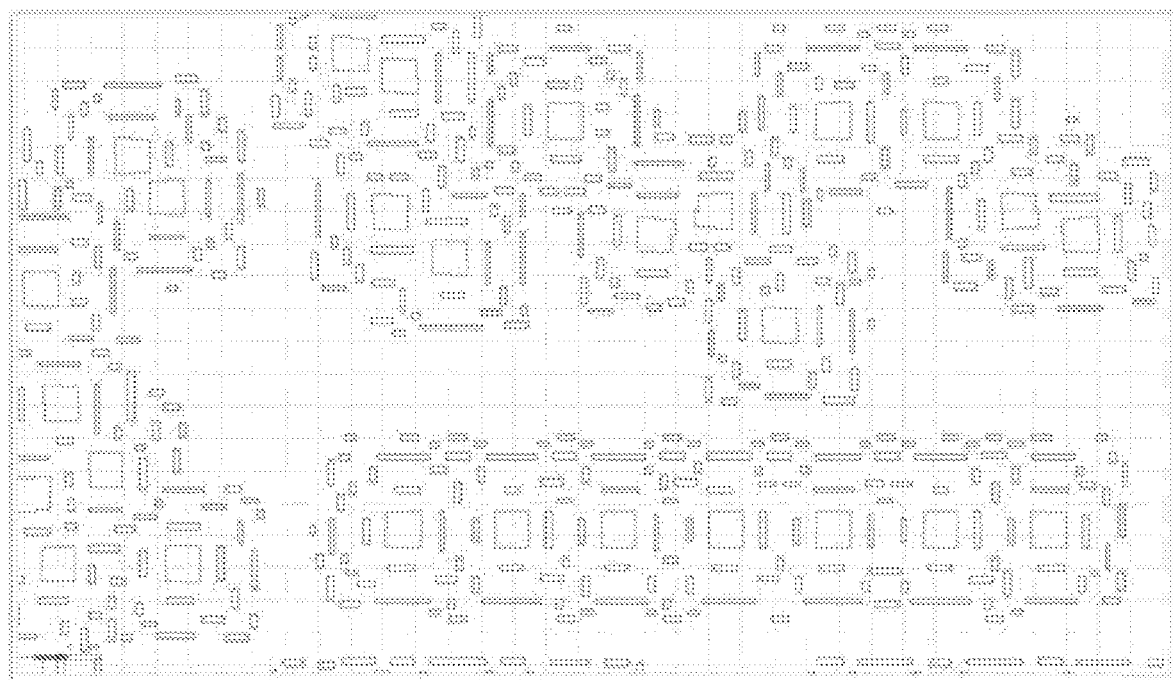
FIG. 11 is a schematic diagram of a mask where assistant features are placed in the assistant feature placement area in the method according to the first embodiment of the present invention.

Referring to FIG. 11, it shows an optimized mask layout which is optimized with the edges of the main pattern and the assistant feature sample points as the optimization variable x. The edges of the main pattern are moved accordingly, and the assistant features are generated based on the signal value of the assistant feature signal sample points.

Figure 12:
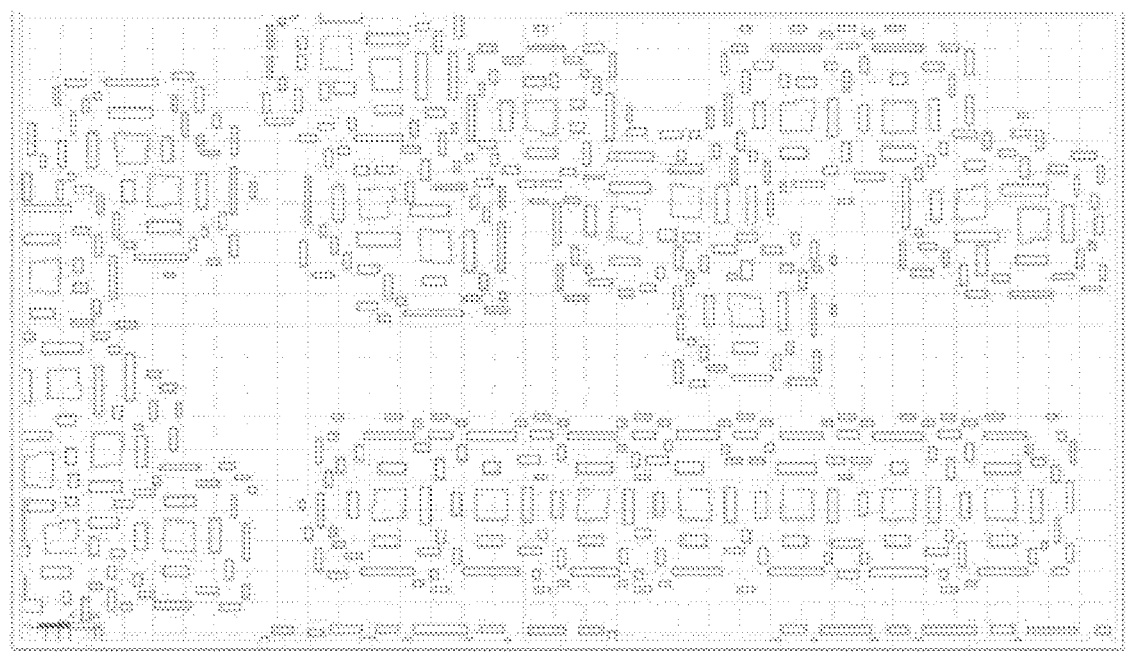
FIG. 12 is a schematic diagram of an optimized mask when the edges of the main pattern and that of the assistant feature are regarded as the optimization variable in the method according to the first embodiment of the present invention.

Referring to FIG. 12, the mask is optimized with a combination of the edges of the main pattern as the optimization variable and the edges of the assistant feature as the optimization variable. As shown in FIG. 12, it shows a final optimized mask pattern.

Figure 13:
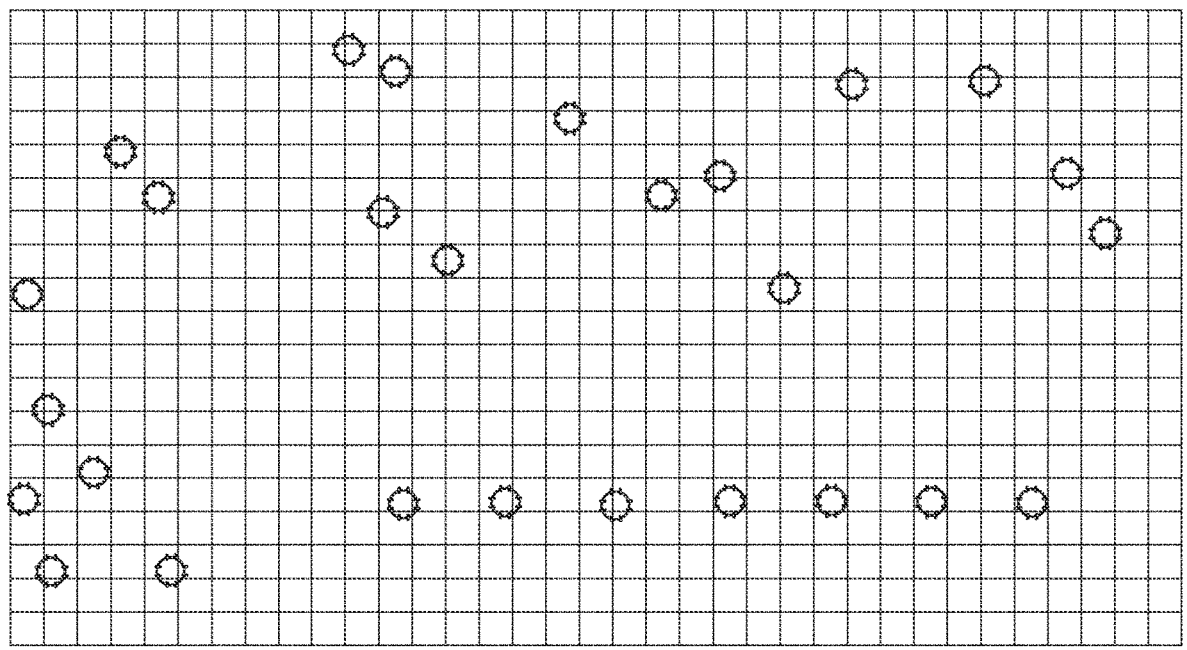
FIG. 13 is a schematic diagram of a resist image of the optimized mask in the method according to the first embodiment of the present invention.

Referring to FIG. 13, the resist image obtained by an optimization calculation on the final optimized mask is consistent with the monitoring points placed on the design layout of the initial design mask. Therefore, the method for Hessian-Free photolithography mask optimization provided by the present invention has a better optimization effect.

Meanwhile, a statistical analysis on EPE (Edge Placement Error) and PV band (distribution width of EPE of a certain detection point under different exposure conditions) is performed to obtain the following values:

| Exposure Condition | Maximum EPE (nm) |
| --- | --- |
| NC | 0.378 |
| PD3 | 1.476 |
| ND3 | 1.542 |

Wherein, EPE refers to an error between edges of the pattern on the silicon wafer and that of the actual required pattern (target pattern), which is calculated by the objective function.

PV band refers to a distribution width of EPE under different exposure conditions. Maximum PV band=2.97 nm.

It can be seen that the method for Hessian-Free photolithography mask optimization provided by the present invention has a better optimization effect.

Figure 14:
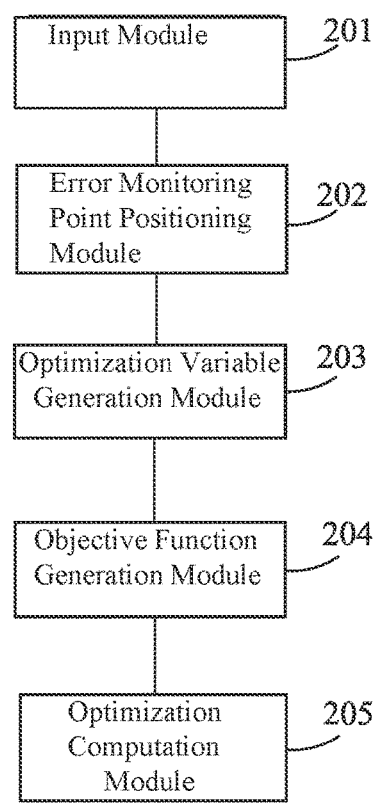
FIG. 14 is a schematic diagram of modules of an apparatus for Hessian-Free photolithography mask according to a second embodiment of the present invention.

Referring to FIG. 14, a second embodiment of the present invention provides an apparatus 200 for Hessian-Free photolithography mask optimization. The apparatus 200 includes an input module 201, an error monitoring point positioning module 202, an optimization variable generation module 203, an objective function generation module 204, and an optimization computation module 205.

The input module 201 is configured to input a design layout of a mask to be optimized.

The error monitoring point positioning module 202 is configured to position error monitoring points on the design layout of the mask to be optimized.

The optimization variable generation module 203 is configured to obtain an optimization variable x of the mask to be optimized.

The objective function generation module 204 is configured to form an objective function cost on the optimization variable x.

The optimization computation module 205 is configured to optimize the objective function cost based on a Hessian-Free-based conjugate gradient method to obtain an optimization result of the mask to be optimized.

Figure 15:
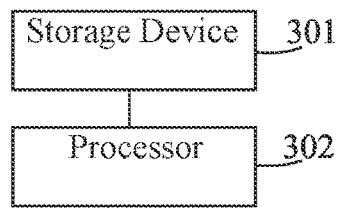
FIG. 15 is a schematic diagram of modules of an electronic device according to a third embodiment of the present invention.

Referring to FIG. 15, a third embodiment of the present invention provides an electronic device 300 which includes one or more processors 302, a storage device 301 for storing one or more programs. When the one or more programs are executed by the one or more processors 302, the one or more processors 302 implement any step of the method for Hessian-Free photolithography mask optimization provided in the first embodiment.

Figure 16:
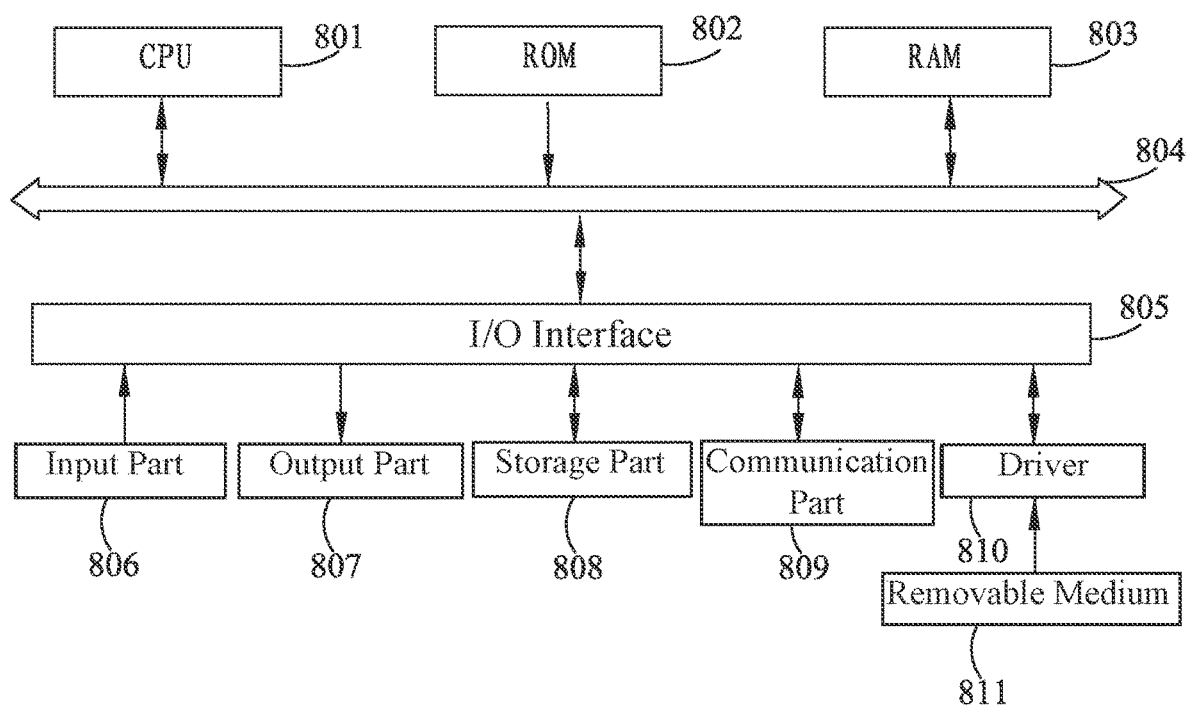
FIG. 16 is a schematic diagram of a computer system of a server applicable for implementing embodiments of the present invention.

Referring to FIG. 16, it shows a computer system 800 of a terminal device/server applicable for implementing embodiments of the present invention. The terminal device/server shown in FIG. 16 is only an example, and should not bring any limitation to the functions and the scope of the present application.

As shown in FIG. 16, the computer system 800 includes a central processing unit (CPU) 801, a read-only memory (ROM) 802 and a random access memory (RAM) 803. The central processing unit (CPU) 801 can perform various appropriate actions and processing according to a program which is stored in the read-only memory (ROM) 802 or loaded from a storage part 808 into the random access memory (RAM) 803. In the RAM 803, various programs and data for the operation of the computer system 800 are also stored. The CPU 801, the ROM 802, and the RAM 803 are connected through a bus 804. An input/output (I/O) interface 805 is also connected to the bus 804.

The following components are connected to the I/O interface 805: an input part 806 including a keyboard, a mouse, etc.; an output part 807 including a cathode ray tube (CRT), a liquid crystal display (LCD), a speaker, etc.; a storage part 808 including a hard disk, etc.; and a communication part 809 including a network interface card such as a LAN card, a modem, etc. The communication part 809 performs communication processing via a network such as the Internet. A driver 810 is also connected to the I/O interface 805 based on needs. A removable medium 811, such as a magnetic disk, an optical disk, a magneto-optical disk, a semiconductor memory, etc., is installed on the driver 810 based on needs, so that a computer program read from it is installed into the storage part 808 based on needs.

According to the embodiments of the present invention, the process described above may be implemented as a computer software program. For example, embodiments of the present invention include a computer program product that includes a computer program carried on a computer-readable medium. The computer program includes program codes for executing a method shown in a flow chart. In such an embodiment, the computer program may be downloaded and installed from the network through the communication part 809, and/or installed from the removable medium 811. When the computer program is executed by the central processing unit (CPU) 801, the above functions defined in the method of the present invention are executed. It should be noted that the computer-readable medium described in the present invention can be a computer-readable signal medium or a computer-readable storage medium or any combination of the two. The computer-readable storage medium can include, but is not limited to, systems, devices or components including, but not limited to, electrical, magnetic, optical, electromagnetic, infrared, or semiconductor, or any combination of the above. More detailed examples of the computer-readable storage medium may include, but are not limited to, an electrical connection with one or more wires, a portable computer disk, a hard disk, a random access memory (RAM), a read-only memory (ROM), an erasable programmable read-only memory (EPROM or flash memory), an optical fiber, a portable compact disk read-only memory (CD-ROM), an optical storage device, a magnetic storage device or any suitable combination of the above.

The computer program codes for performing the operations of the present invention can be written in one or more programming languages or a combination thereof. The programming languages include object-oriented programming languages such as Java, Smalltalk, C++, and conventional procedural programming languages such as "C" or similar programming languages. The program codes can be completely executed on a user's computer, partially executed on the user's computer, executed as an independent software package, partially executed on the user's computer and partially executed on a remote computer, or completely executed on the remote computer or a server. In the case involving a remote computer, the remote computer may be connected to the user's computer through any kind of networks, including a local area network (LAN) or a wide area network (WAN), or may be connected to an external computer (e.g., through the Internet using an Internet service provider).

The flowcharts and block diagrams in the accompanying drawings illustrate possible system architectures, functions, and operations of the system, method, and computer program product according to various embodiments of the present invention. In this regard, each block in the flowcharts or block diagrams may refer to a module, a program segment, or a part of code. The module, program segment, or part of code contains one or more executable instructions for realizing specified logic functions. It should be noted that, in some alternative embodiments, the functions marked in the block may also occur in an order different from that marked in the drawings. For example, two blocks shown in succession can actually be executed substantially in parallel, and they can sometimes be executed in a reverse order, depending on the functions involved. It should also be noted that each block in the block diagrams and/or flowcharts, and a combination of blocks in the block diagrams and/or flowcharts, can be realized by a dedicated hardware-based system that performs the specified functions or operations. Or it can be realized by a combination of dedicated hardware and computer instructions.

The units involved in the embodiments described in the present invention can be implemented in software or hardware. The units can also be set in a processor, for example, it can be described as: a processor includes an input module, an error monitoring point placement module, an optimization variable generation module, an objective function generation module, and an optimization computation module. Wherein, the names of these units do not constitute a limitation on the unit itself under certain circumstances. For example, the input module can also be described as "configured to input a design layout of a mask to be optimized". On the other hand, the present invention also provides a computer-readable medium. The computer-readable medium may be included in the device described in the above embodiment; or it may exist alone without being assembled into the device. The above-mentioned computer-readable medium carries one or more programs. When the one or more programs are executed by the device, the device inputs a design layout of a mask to be optimized, places error monitoring points on the design layout of the mask to be optimized, obtains an optimization variable x of the mask to be optimized, forms an objective function cost on the optimization variable x, and optimizes the objective function cost based on a Hessian-Free-based conjugate gradient method to obtain an optimization result of the mask to be optimized.

The foregoing descriptions of the embodiments according to the present invention should not be construed as limiting the scope of the invention but as merely providing illustrations of some of the preferred embodiments thereof. Thus the scope of the invention should be determined by the appended claims and their legal equivalents. Furthermore, it will be apparent to those skilled in the art that various modifications, equivalents and improvements can be made herein within the scope of the invention.

The invention claimed is:

1. A method for Hessian-Free photolithography mask optimization, for optimizing a mask to be optimized, comprising the following steps:
   S1, inputting a design layout of a mask to be optimized;
   S2, positioning error monitoring points on the design layout of the mask to be optimized;
   S3, obtaining an optimization variable x of the mask to be optimized;
   S4, forming an objective function cost on the optimization variable x; and
   S5, optimizing the objective function cost by a Hessian-Free-based conjugate gradient method, to obtain an optimization result of the mask to be optimized;
   wherein the objective function cost is defined as:

$$\cos t = \sum_{i,j} W_{ci} \cdot W_{pj} \cdot [\text{Signal}(ci, pj)]^{power};$$

in the formula, ci is an i-th exposure condition, pj is a i-th error monitoring point, power is a preset positive and even value (power=2, 4, 6 . . . ), Signal(ci, pj) is a signal error value at the j-th error monitoring point under the i-th exposure condition; the signal error value comprises an intensity of RI or a value of EPE, the RI is an image on a photoresist, and the EPE is an edge placement error.

2. The method for Hessian-Free photolithography mask optimization according to claim 1, wherein the mask to be optimized comprises at least one main pattern; in step S3, the optimization variable x of the mask to be optimized comprises edges of the main pattern and/or assistant feature sample points generated around the main pattern, or edges of an assistant feature which is generated according to signal values of the assistant feature sample points.

3. The method for Hessian-Free photolithography mask optimization according to claim 1, wherein step S5 specifically comprises the following steps:
   S51, setting an initial optimization variable value $x_0$ of the objective function cost;
   S52, calculating a gradient value $g_0$ of the initial optimization variable value $x_0$;
   S53, determining whether the gradient value $g_0$ is less than a preset threshold; if so, performing the following step:
   S54, terminating the optimization process, and obtaining an optimization result of the mask to be optimized;
   if not, performing the following step:
   S55, iteratively updating an optimization variable $x_k$ based on a relation between $H \cdot p_k$ and an intrinsic vector $v_k$ of the optimization variable $x_k$, to obtain an updated optimization variable $x_{k+1}$, wherein H is a Hessian matrix of the objective function cost, $p_k = -g_k$, and $g_k$ is a gradient of the optimization variable $x_k$ relative to the objective function cost.

4. The method for Hessian-Free photolithography mask optimization according to claim 3, wherein step S55 comprises the following steps:
   S551, calculating a coefficient $\alpha_k$;
   the $\alpha^k$ is defined as:

$$\alpha_k = \frac{r_k^T r_k}{p_k^T (H \cdot p_k)},$$

wherein $r_k = -g_k$, $p_k = r_k$, and $r_k^T$ is obtained by performing a transpose operation on $r_k$;
   S552, calculating a coefficient $v_{k+1} = v_k + \alpha_k p_k$; and
   S553, updating the optimization variable: $x_{k+1} = x_k + v_{k+1}$.

5. The method for Hessian-Free photolithography mask optimization according to claim 4, wherein step S5 further comprises the following steps:
   S56, calculating a gradient value $r_{k+1}$ of the optimization variation $x_{k+1}$ which is iteratively optimized, by a calculation result of the $H \cdot p_k$;
   S57, determining whether $|r_{k+1}|$ is less than the preset threshold; if so, performing the following step:
   S58, terminating the optimization process;
   if not, performing the following step:
   S59, calculating coefficients $\beta_k$ and $p_{k+1}$, and returning to step S55 until the optimization process is finished, wherein $$\beta_k = \frac{r_{k+1}^T r_{k+1}}{r_k^T r_k}, \quad p_{k+1} = r_{k+1} + \beta_k p_k.$$

6. The method for Hessian-Free photolithography mask optimization according to claim 5, wherein obtaining the $H \cdot p_k$ comprises the following steps:
   T01, defining an operator:

$$Rv[f(x)] = \frac{\partial f(x + rv)}{\partial r} \bigg| r = 0;$$

and
   T02, calculating $(H \cdot v)_k$,
   $(H \cdot v)_k$ can be calculated by the following formula:

$$(H \cdot v)_k = \sum_i p \cdot (p-1) \cdot [\text{Signal}(ci, pj)]^{p-2} \cdot$$

$$\frac{\partial [\text{Signal}(ci, pj)](x)}{\partial x_k} \cdot Rv([\text{Signal}(ci, pj)]);$$

wherein in step T02, when the Signal(ci, pj) is the intensity of the RI, the intensity of the RI can be obtained by the following steps:

T021, calculating $$RI_i = \sum_m q_{im} AI_m,$$

wherein $q_{im}$ is a photoresist coefficient;

T022, calculating $$AI_m = \sum_n \lambda_n |EI_{n,m}|^2,$$

wherein $\lambda_n$ is a n-th intrinsic coefficient of a TCC matrix;

T023, calculating $$EI_{n,m} = \sum_t h_{m,t} MI_t,$$

wherein $h_{m,t}$ is an intrinsic vector of the TCC matrix;

T024, calculating $$MI_t = MI_t(0) + \sum_o S_{t,o} \cdot E_o + \sum_l d_{t,l} P_l,$$

wherein $s_{t,o}$ and $d_{t,l}$ are linear coefficients of a calculation from a mask to a gridded mask, $E_o$ is an offset variable of the edges of the main pattern, $P_l$ is the signal value of the assistant feature sample points, $MI_t(0)$ is an initial value, that is, an initial MI when the $E_o$ and the $P_l$ are both 0;

T025, calculating $$Rv(MI_t) = \sum_o S_{t,o} \cdot v_o \sum_l d_{t,l} \cdot v_l,$$

wherein $v_o$ is an o-th component of v, $v_l$ is a l-th component of v; and

T026, calculating Rv(RI);

wherein the Rv(RI) can be obtained by the following steps:

T0261, calculating $$Rv(RI_i) = \sum_m q_{im} Rv(AI_m);$$

T0262, calculating $$Rv(AI_m) = \sum_n \lambda_n \cdot [EI_{n,m} \cdot Rv(EI^*_{n,m}) + Rv(EI_{n,m}) \cdot EI^*_{n,m}];$$

T0263, calculating $$Rv(EI_{n,m}) = \sum_t h_{m,t} \cdot Rv(MI_t);$$

and

T0264, calculating $$Rv(EI^*_{n,m}) = \sum_t h^*_{m,t} Rv(MI^*_t);$$

wherein $Rv(EI^*_{n,m})$ can be obtained by performing a conjugate operation on $Rv(EI_{n,m})$, $h^*_{m,t}$ can be obtained by performing a conjugate operation on $h_{m,t}$, $EI^*_{n,m}$ can be obtained by performing a conjugate operation on $EI_{n,m}$, and $Rv(MI^*_t)$ can be obtained by performing a conjugate operation on $Rv(MI_t)$.

7. The method for Hessian-Free photolithography mask optimization according to claim 6, wherein when the Signal (ci, pj) is EPE, the EPE can be obtained by the following steps:

T027, calculating $$EPE_i = \frac{RI_i}{RI'_i};$$

T028, calculating $$RI'_i = \sum_j d_{i,j} RI_j,$$

wherein $RI'_i$ is a gradient of the RI at a monitoring point i;

T029, calculating $$Rv(EPE_i) = Rv\left(\frac{RI_i}{RI'_i}\right)$$
$$= -\frac{RI_i}{(RI'_i)^2} Rv(RI'_i) + \frac{1}{RI'_i} Rv(RI_i);$$

and

T030, calculating $$Rv(RI'_i) = \sum_j d_{i,j} Rv(RI_j);$$

wherein $d_{i,j}$ is the linear coefficient of the calculation from the mask to the gridded mask, and Rv(RI) can be obtained by the above steps T0261-T0264.

8. An apparatus for Hessian-Free photolithography mask optimization, comprising:

an input module, configured to input a design layout of a mask to be optimized;

an error monitoring point positioning module, configured to position error monitoring points on the design layout of the mask to be optimized;

an optimization variable generation module, configured to obtain an optimization variable x of the mask to be optimized;

an objective function generation module, configured to form an objective function cost on the optimization variable x; and an optimization computation module, configured to optimize the objective function cost based on a Hessian-Free-based conjugate gradient method to obtain an optimization result of the mask to be optimized;

wherein the objective function cost is defined as:

$$\cos t = \sum_{i,j} W_{ci} \cdot W_{pj} \cdot [\text{Signal}(ci, pj)]^{power};$$

in the formula, ci is an i-th exposure condition, pj is a j-th error monitoring point, power is a preset positive and even value (power=2, 4, 6 . . . ), Signal(ci, pj) is a signal error value at the i-th error monitoring point under the i-th exposure condition; the signal error value comprises an intensity of RI or a value of EPE, the RI is an image on a photoresist, and the EPE is an edge placement error.

9. An electronic device, comprising one or more processors, and a storage device for storing one or more programs;

when the one or more programs are executed by the one or more processors, the one or more processors implement any step of the method of claim 1.

* * * * *